(12) United States Patent
Creed et al.

(10) Patent No.: US 6,664,826 B1
(45) Date of Patent: Dec. 16, 2003

(54) LOOP FILTER AND AMPLIFIER FOR IMPROVED PHASE MARGIN AND DECREASED PHASE NOISE WITH VCOS

(75) Inventors: Brian Creed, Batavia, IL (US); David J. Smentek, Addison, IL (US); William C. Hart, Huntley, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/620,192

(22) Filed: Jul. 20, 2000

(51) Int. Cl.[7] .............................................. H03L 7/06
(52) U.S. Cl. ....................... 327/147; 327/149; 327/156
(58) Field of Search ................................. 327/147, 150, 327/156, 159, 162, 175, 16, 17; 331/1 A (56) References Cited

U.S. PATENT DOCUMENTS 5,821,817 A * 10/1998 McCorkle .................. 331/1 A
5,889,438 A * 3/1999 Yamaguchi .................. 331/17
6,114,888 A * 9/2000 Walley ........................ 327/157
6,157,271 A * 12/2000 Black et al. ................. 332/127

* cited by examiner

*Primary Examiner*—My-Trang Nu Ton
*Assistant Examiner*—Hiep Nguyen (57) ABSTRACT

A loop filter and amplifier (206) is configured to generate a control voltage ($V_C$) by applying low gain to a correction voltage ($V_P$) in response to an input signal ($V_{H/L}$) indicating that the VCO (202) is to operate at low frequencies and applying high gain to the correction voltage in response to the input signal indicating that the VCO is to operate at high frequencies. A loop filter and amplifier (306) is configured to generate a control voltage ($V_C$) by shifting the control voltage by an amount determined by an offset voltage ($V_{OFF}$) and by adjusting the control voltage with a correction voltage ($V_P$). An operational amplifier (310) is configured to generate a difference between the amount determined by the offset voltage and the correction voltage.

26 Claims, 7 Drawing Sheets

LOOP FILTER AND AMPLIFIER FOR IMPROVED PHASE MARGIN AND DECREASED PHASE NOISE WITH VCOS

BACKGROUND OF THE INVENTION

The present invention relates to phase-locked loops (PLL), and more specifically to controlling a wideband, high sensitivity voltage-controlled oscillator (VCO) within a PLL.

A Hybrid Fiber-Coax (HFC) system is a cable architecture for providing residential video, voice telephony, data, and other interactive services to subscribers' homes over fiber optic and coaxial cables. HFC systems operate over radio-frequency (RF) carriers. With respect to the downstream transmission path, cable router upconverters at the cable system head-end perform the modulation function, and cable modem receivers at subscribers' premises perform the demodulation function. One typical modulation scheme used in the downstream path is Quadrature Amplitude Modulation (QAM).

The Data Over Cable Service Interface Specification (DOCSIS) defines interface requirements for cable modems involved in high-speed data distribution over cable television networks. Cable modem receivers and cable router upconverters in HFC data networks are required to operate over a wide downstream frequency band of 88–860 MHZ. For both the cable modem and the router, a wideband phase-locked loop (PLL) is necessary to tune the approximately 800 MHZ wide band. The wideband PLLs must be capable of tuning the 800 MHZ band while maintaining the noise characteristics and stability necessary for 256 QAM demodulation and modulation, as well as meeting the stringent DOCSIS performance specifications.

With respect to the cable router upconverter, or cable modem termination system (CMTS) as referred to by DOCSIS, meeting the PLL design requirements for loop stability, phase noise performance, and the wide operating range has meant trading off between the available DC tuning range versus performance and stability. In order to meet the stringent DOCSIS CMTS phase noise specifications, current upconverter designs use a split band approach that employs multiple, narrower range upconverters that tune some smaller portion of the downstream frequency band. With this scheme the downstream frequency band is broken into two or more sections with each range of frequencies having its own module with a separate voltage-controlled oscillator (VCO).

The use of multiple VCO modules is undesirable. Specifically, in the competitive DOCSIS standard cable data market, it is important from a marketing standpoint that a single upconverter card cover the entire downstream frequency range. A single full-band card solution relieves manufacturers from having to build, track, and stock multiple modules. For the Multiple Service Operators (MSOs), a single card alleviates similar ordering and stocking difficulties and simplifies network management by eliminating the need to track upconverter type with downstream channel assignment. There is also an incomplete solution stigma associated with requiring multiple modules.

Wideband VCOs are presently available that will tune the entire frequency range and could allow for a single VCO module, full-band upconverter. A disadvantage with this approach, however, is that any VCO designed to cover the full 800 MHZ bandwidth generally requires both a large control voltage range and high tuning sensitivity (MHZ/Volt). Large control voltage requirements mean that PLL loop filter DC gain must be added. Increasing loop filter gain allows for supplying the large control voltage range, but the added gain degrades phase noise performance and decreases loop stability. As an alternative, the VCO sensitivity could be increased to allow for reduced loop filter gain, but this accomplishes little as the gain is not being reduced but is simply being moved to a different place in the loop, resulting in the same stability and phase noise problems.

Thus, there is a need for an apparatus and/or method for generating the necessary control voltage for a wideband VCO while adding minimal noise and maintaining stability of the loop.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

Corresponding reference characters indicate corresponding components throughout several views of the drawing.

DETAILED DESCRIPTION OF A PREFERRED EMBODIMENT

The following description of an embodiment of the invention is not to be taken in a limiting sense, but is made merely for the purpose of describing the general principles of the invention. The scope of the invention should be determined with reference to the claims.

Figure 1:
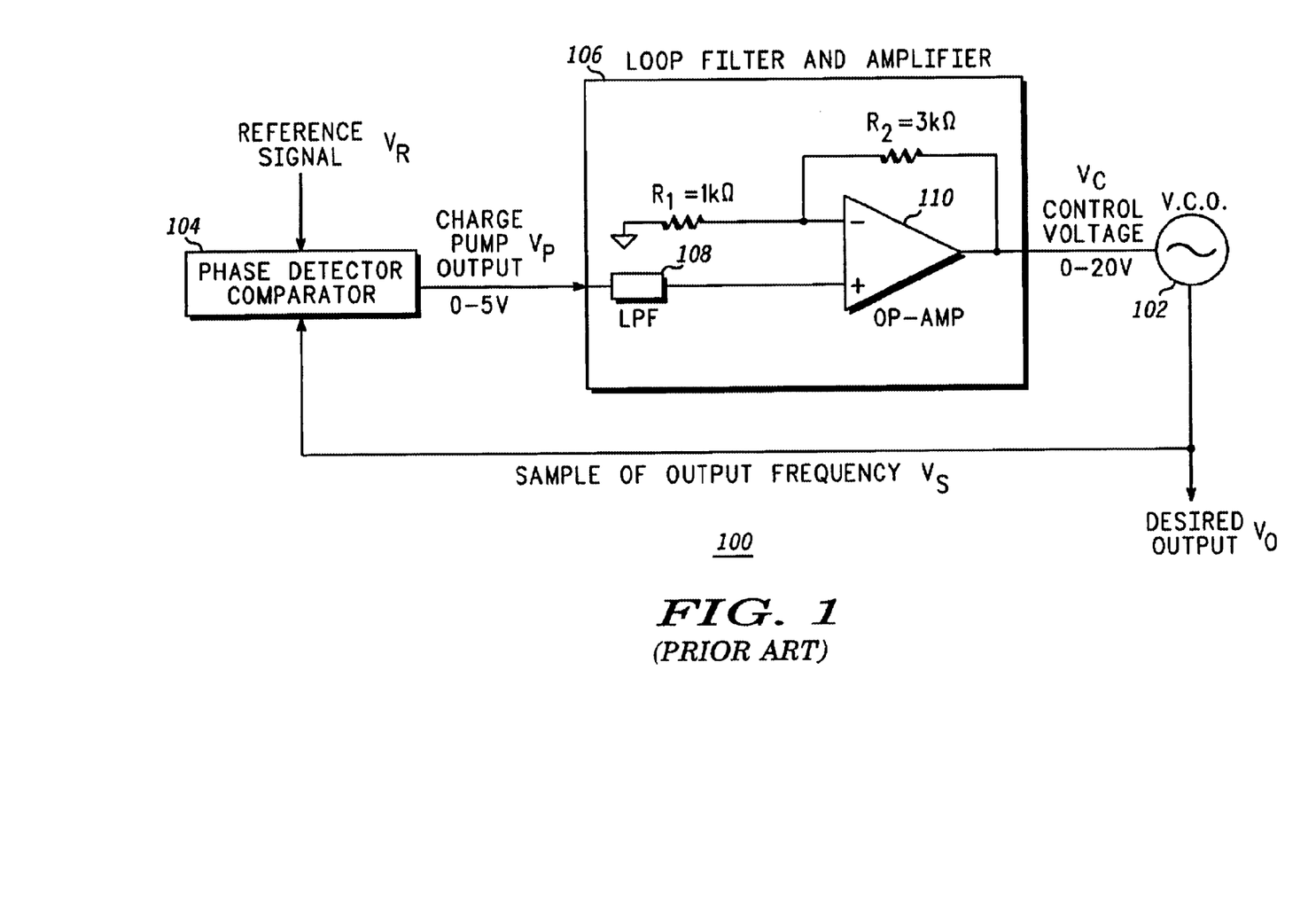
FIG. 1 is a schematic diagram illustrating a conventional PLL.

Referring to FIG. 1, the operation of a conventional phase-locked loop (PLL) 100 having a wideband voltage-controlled oscillator (VCO) 102 will first be examined. The PLL 100 is a closed loop system wherein the desired output signal $V_O$ is synchronized in phase and frequency with a received reference signal $V_R$. The PLL 100 includes a phase detector/comparator 104, a loop filter and amplifier 106, and the VCO 102. Phase lock is accomplished by comparing the phases of the output signal $V_O$ (or a multiple or sub-multiple of it) and the reference signal $V_R$ (or a multiple or sub-multiple of it) in the phase detector/comparator 104. Any phase difference between these signals is converted into a correction voltage $V_P$, which is typically the output of a charge pump. The correction voltage $V_P$ is received by the loop filter and amplifier 106, which generates a control voltage $V_C$ for the VCO 102. The control voltage $V_C$ causes the phase of the output signal $V_O$ to change so that it tracks the reference signal $V_R$, thus locking the VCO 102 to the frequency of the incoming reference signal $V_R$.

As mentioned above, a wideband VCO, such as the VCO 102, generally requires both a large control voltage $V_C$ range and high tuning sensitivity (MHZ/Volt). A large control voltage $V_C$ range is necessary in order to adjust the VCO 102 to cover the full frequency bandwidth, such as the 88–860 MHZ downstream frequency band in HFC data networks. The large control voltage $V_C$ range is typically generated by adding DC gain in the loop filter and amplifier 106.

The loop filter and amplifier 106 includes a low pass filter (LPF) 108 and an operational amplifier (op-amp) 110. The op-amp 110, which is used for adding the DC gain, is connected to operate as a linear noninverting amplifier. As such, it operates according to equation (1):

$$\frac{V_C}{V_P} = 1 + \frac{R_2}{R_1} \quad (1)$$

In order to illustrate the gain produced by the op-amp 110, it will be assumed that resistors $R_1$=1 KΩ and $R_2$=3 KΩ and that $V_P$=5 Volts. According to equation (1), the control voltage $V_C$=20 Volts. Thus, if the range of the correction voltage $V_P$ is 0–5 Volts, the range of the control voltage $V_C$ will be 0–20 Volts. Although the 0–20 Volt control voltage $V_C$ range is large enough to control the wideband VCO 102, the added DC gain in the loop filter and amplifier 106 disadvantageously degrades phase noise performance and decreases stability of the PLL 100.

Figure 2:
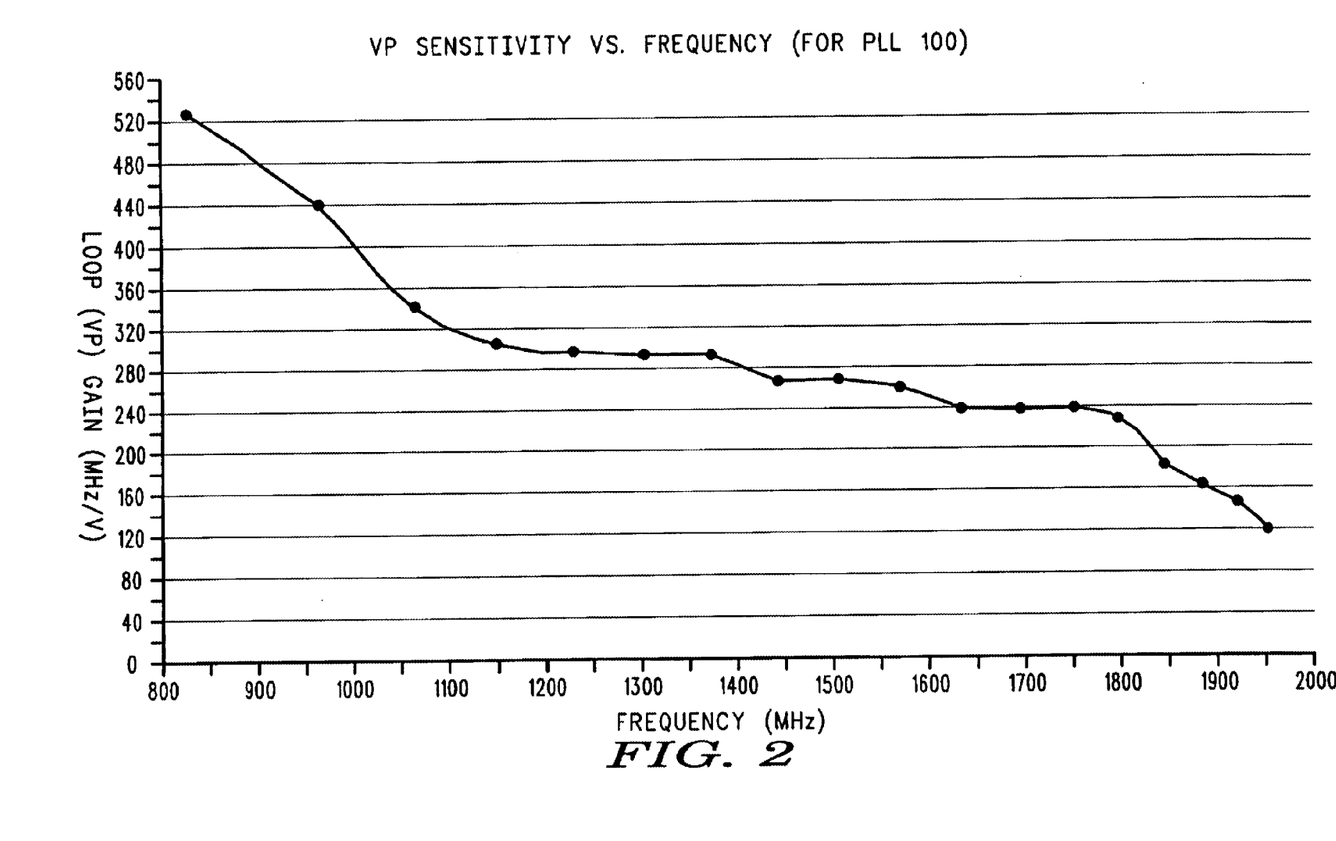
FIG. 2 is a gain versus frequency plot illustrating the operation of the PLL shown in FIG. 1.

VCO characteristics are such that the sensitivity (MHZ/Volt) of the VCO 102 itself decreases as the frequency increases. Thus, for positive gain in the loop filter and amplifier 106, the sensitivity (MHZ/Volt) of the correction voltage $V_P$ also decreases as the frequency of the VCO 102 increases. Referring to FIG. 2, there is illustrated a loop gain sensitivity (i.e., sensitivity of the correction voltage $V_P$) versus frequency plot for the PLL 100. As can be seen from the plot, when operating at low VCO frequencies, the highly non-linear tuning response curve of the VCO is at its highest sensitivity. This is where the loop is most susceptible to stability problems and phase noise degradation. The illustrated high sensitivity of $V_P$ at low VCO frequencies is due to the combined effect of the sensitivity of the VCO 102 itself being higher at low frequencies and the high gain of the loop filter and amplifier 106.

Figure 3:
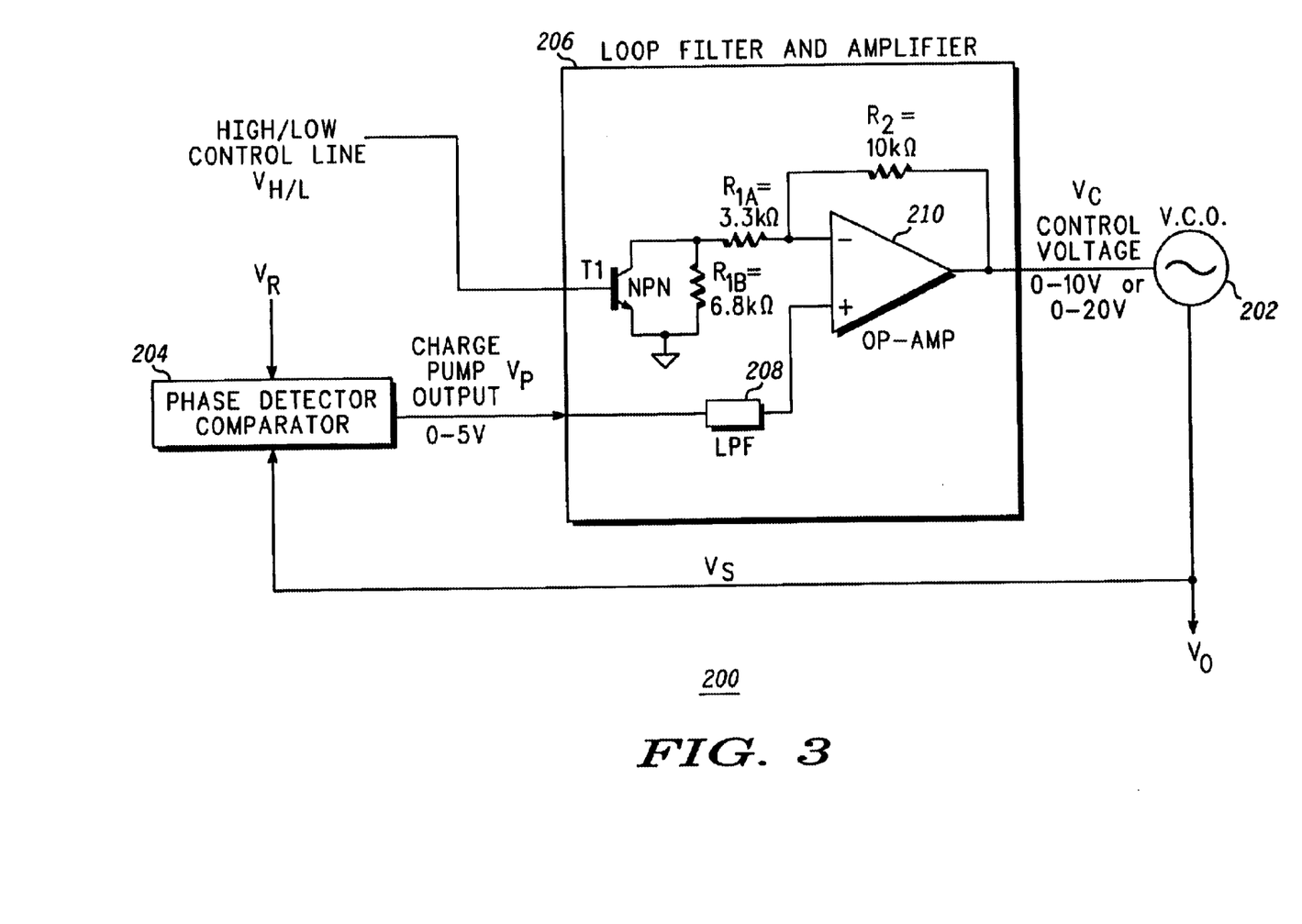
FIG. 3 is a schematic diagram illustrating a PLL made in accordance with the present invention.

Referring to FIG. 3, there is illustrated a PLL 200 made in accordance with the present invention. The PLL 200 includes means that are ideal for controlling a wideband, high sensitivity VCO within the PLL 200 with improved loop stability and phase noise performance. While the PLL 200 is ideal for controlling a VCO having a wide tuning range, such as a tuning range greater than an octave (i.e., a 2-to-1 frequency change), it should be well understood that the present invention may be used for controlling VCOs having any size tuning range.

The PLL 200 employs a unique method for lowering the overall gain of the PLL, thus allowing for the improved phase margin and better phase noise performance. One principle behind the design of the PLL 200 is the recognition that it is not necessary to have high gain at lower operating frequencies. Specifically, in a preferred embodiment, the PLL 200 selectively lowers the DC gain of the loop filter and amplifier 206 only when operating at low VCO frequencies. As discussed above, at low VCO frequencies the highly non-linear tuning response curve of the VCO 202 is at its highest sensitivity, and thus, the loop is most susceptible to stability problems and phase noise degradation. For higher frequencies, the DC gain of the loop filter and amplifier 206 is increased so as to generate sufficient range in the control voltage $V_C$.

The DC gain of the loop filter and amplifier 206 is a controllable parameter, which allows the gain to be selectively lowered when operating at low VCO frequencies. Specifically, in the illustrated embodiment, the loop filter and amplifier 206 includes an NPN transistor T1 that has its collector coupled to resistor $R_{1A}$ and its emitter coupled to ground. The base of transistor T1 is used as a high/low control line $V_{H/L}$. When transistor T1 is turned off by $V_{H/L}$, resistors $R_{1A}$ and $R_{1B}$ are connected in series between the inverting terminal of the op-amp 210 and ground. When transistor T1 is turned on by $V_{H/L}$, resistor $R_{1B}$ is shorted out, leaving only resistor $R_{1A}$ being connected between the inverting terminal of the op-amp 210 and ground.

Through the use of transistor T1 and the high/low control line $V_{H/L}$, the gain of the op-amp 210 can be reduced at the low end of the downstream frequency band where a lower control voltage $V_C$ is used. An example will be used to illustrate the manner in which the high/low control line $V_{H/L}$ is used to selectively lower the DC gain of the loop filter and amplifier 206. For this example it will be assumed that resistors $R_{1A}$=3.3 KΩ, $R_{1B}$=6.8 KΩ and $R_2$=10 KΩ and that $V_P$=5 Volts. When transistor T1 is turned on by $V_{H/L}$, resistor $R_1$ in equation (1) above is simply equal to $R_{1A}$ or 3.3 KΩ. Using these values, equation (1) provides:

$$V_C = V_P\left(1 + \frac{R_2}{R_1}\right) = 5\left(1 + \frac{10\ K}{3.3\ K}\right) = 20.15$$

Thus, for the scenario where transistor T1 is turned on, the control voltage $V_C$ range is approximately 0–20 Volts. This setting will be referred to herein as the high gain setting.

On the other hand, when transistor T1 is turned off by $V_{H/L}$, resistor $R_1$ in equation (1) above is equal to $R_{1A}+R_{1B}$, or 3.3 KΩ+6.8 KΩ=10.1 KΩ. Using these values, equation (1) provides:

$$V_C = V_P\left(1 + \frac{R_2}{R_1}\right) = 5\left(1 + \frac{10\ K}{10.1\ K}\right) = 9.95$$

Thus, for the scenario where transistor T1 is turned off, the control voltage $V_C$ range is approximately 0–10 Volts. This setting will be referred to herein as the low gain setting.

As illustrated, transistor T1 can be turned on and off by the high/low control line $V_{H/L}$ to change the gain of the loop filter and amplifier 206. In the above example, the two different gain settings are used to switch between the control voltage $V_C$ ranges of 0–20 Volts and 0–10 Volts. Gain switching in this manner helps to linearize the tuning response of the loop and improves phase noise and stability at low frequencies.

Figure 4:
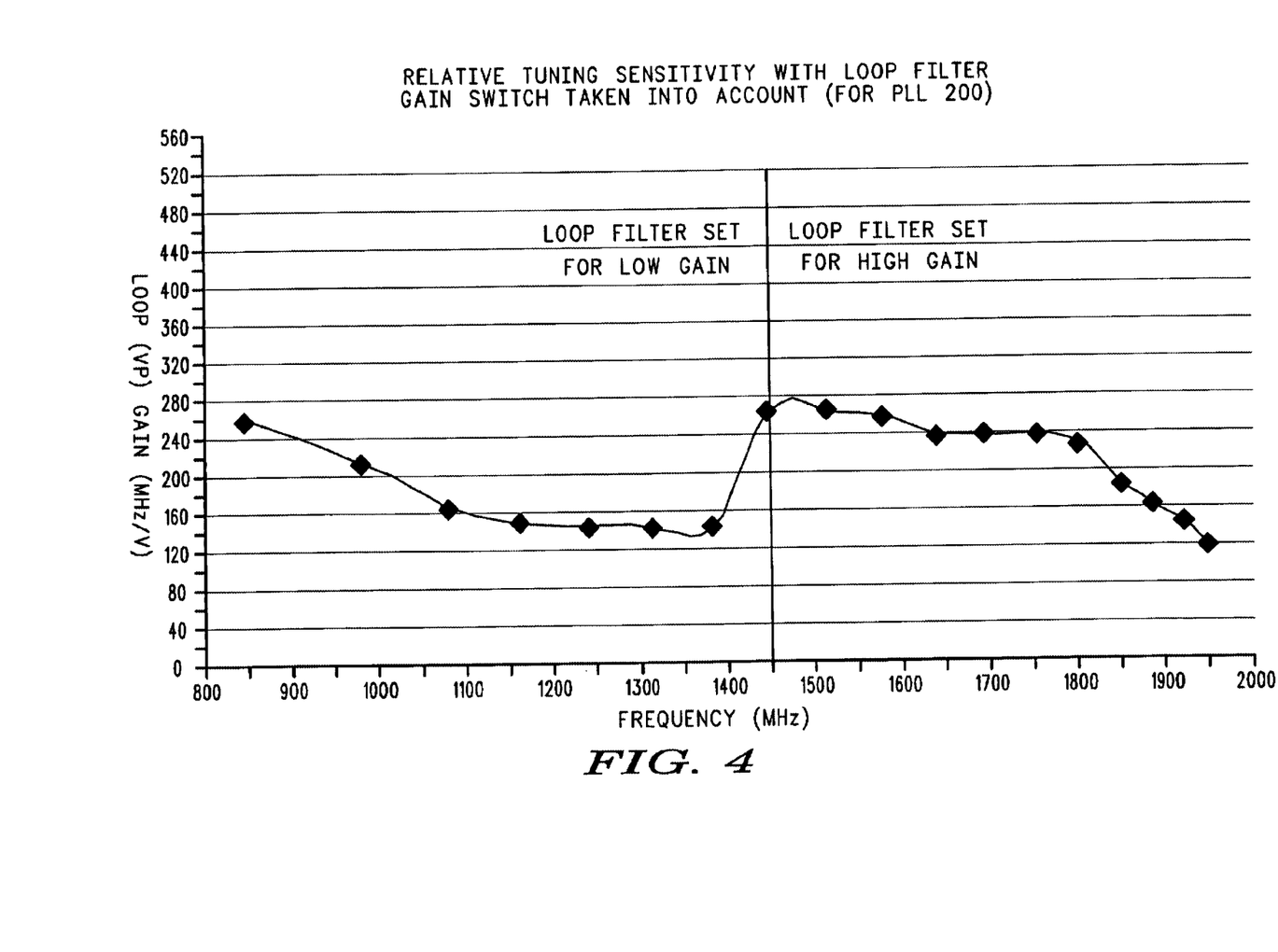
FIG. 4 is a gain versus frequency plot illustrating the operation of the PLL shown in FIG. 3.

FIG. 4 illustrates the manner in which the gain switching employed by the PLL 200 helps to linearize the tuning response of the loop. Specifically, there is illustrated a loop gain sensitivity (i.e., sensitivity of the correction voltage $V_P$) versus frequency plot for the PLL 200. When operating at low VCO frequencies, the loop filter and amplifier 206 is set for low gain, i.e., transistor T1 is turned off. The low gain setting is adequate because it is not necessary to have high gain at lower operating frequencies. This is because the lower operating frequencies can be controlled with a smaller range of control voltage $V_C$. The decreased gain reduces the noise level of the VCO 202 caused by the DC amplification of the correction voltage $V_P$ (i.e., the charge pump output). This improves phase margin and phase noise performance at the low frequencies.

When operating at high VCO frequencies, on the other hand, the loop filter and amplifier 206 is set for high gain, i.e., transistor T1 is turned on. At high frequencies where VCO sensitivity is decreased, and higher control voltages $V_C$ are needed, the gain of the loop filter and amplifier 206 is increased. The overall combined effect of the gain switching capability of the PLL 200 is to flatten the VCO/Loop Filter tuning sensitivity curve as illustrated. In other words, the loop filter and amplifier 206 provides a way of compensating or flattening the typically non-ideal tuning response of the VCO 202 for improved performance at the high tuning sensitivity part of the VCO response curve.

Thus, if the VCO 202 is to operate at low frequencies, the high/low control line $V_{H/L}$ is set to turn transistor T1 off, and the loop filter and amplifier 206 applies a first amount of gain to the correction voltage $V_P$ to generate the control voltage $V_C$. If the VCO 202 is to operate at high frequencies, the high/low control line $V_{H/L}$ is set to turn transistor T1 on, and the loop filter and amplifier 206 applies a second amount of gain to the correction voltage $V_P$ to generate the control voltage $V_C$. The second amount of gain will normally be greater than the first amount of gain. In this way the high/low control line $V_{H/L}$ indicates whether the VCO 202 is to operate at high or low frequencies.

By way of example, the high/low control line $V_{H/L}$ may be controlled by using software to control a digital-to-analog (D/A) converter or any other type of I/O pin. It should also be understood that the illustrated configuration for transistor T1 is just one exemplary way to implement the gain switching function and that there are many other ways to implement this function in accordance with the present invention, including for example the use of PNP transistors and field effect transistors (FETs). Furthermore, the gain switching function does not have to be a "switch". For example, transistor T1 can be replaced with a linearly variable FET or a bipolar junction transistor (BJT) driven by a D/A or other continuously variable adjustment mechanism. It is also possible that more than one switch transistor may be used to provide additional discrete gain steps. These methods would allow for more resolution and greater equalization capability than the Hi/Low gain adjustment described above. However, the gain switching function provided by transistor T1 has the advantage of ease of implementation.

FIG. 4 illustrates two gain settings, i.e., a low gain setting for operation at low frequencies and a high gain setting for operation at high frequencies. In the low gain setting a first amount of gain is applied to the correction voltage $V_P$, and in the high gain setting a second amount of gain is applied to the correction voltage $V_P$. It should be well understood that more than two gain settings may be used in accordance with the present invention. For example, in a three gain settings scenario, a low gain setting could be used for operation at low frequencies, an intermediate gain setting could be used for operation at intermediate frequencies, and a high gain setting used for operation at high frequencies. In the low gain setting a first amount of gain would be applied to the correction voltage $V_P$, in the intermediate gain setting a second amount of gain would be applied to the correction voltage $V_P$, and in the high gain setting a third amount of gain would be applied to the correction voltage $V_P$. Similarly, in a four gain settings scenario there would be four frequency ranges with four different amounts of gain being applied to the correction voltage $V_P$ and so on. In all of these scenarios there will normally be at least a first and a second amount of gain being applied to the correction voltage $V_P$.

Figure 5:
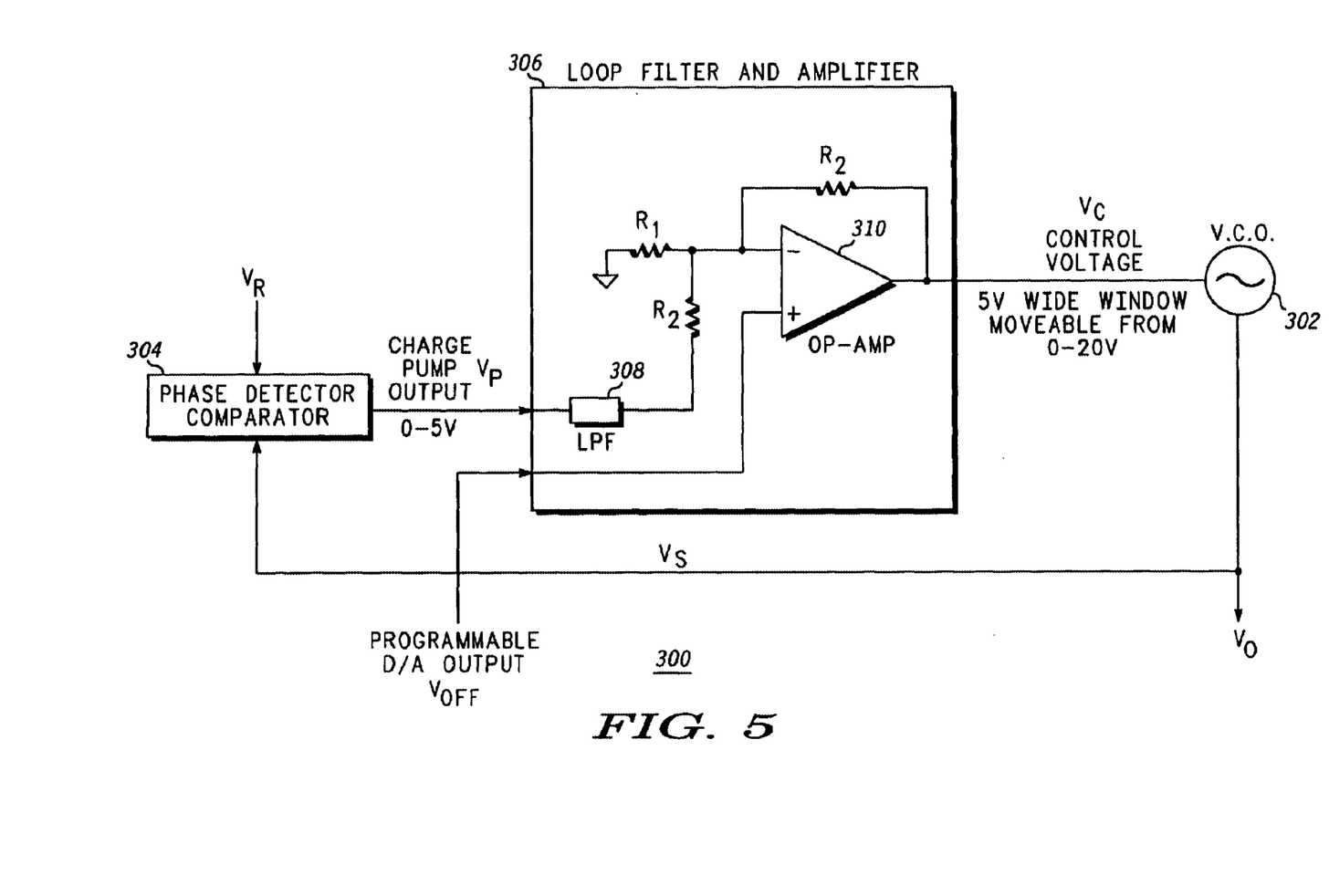
FIG. 5 is a schematic diagram illustrating another PLL made in accordance with the present invention.

Referring to FIG. 5, there is illustrated another PLL 300 made in accordance with the present invention. The PLL 300 also includes means that are ideal for controlling a wideband, high sensitivity VCO within the PLL 300 with improved loop stability and phase noise performance. The PLL 300 lowers the gain of the loop filter and amplifier 306 and improves performance across the entire VCO range. While the PLL 300 is ideal for controlling a VCO having a wide tuning range, it should be well understood that it may be used for controlling VCOs having any size tuning range.

The PLL 300 uses a pre-determined, frequency dependent "coarse tune", independent offset voltage $V_{OFF}$. The offset voltage $V_{OFF}$ is summed with the correction voltage $V_P$ (i.e., the charge pump output) to increase the absolute VCO control voltage $V_C$ where necessary. The offset voltage $V_{OFF}$ acts as a coarse adjustment with the offset value predetermined based on desired VCO frequency. The tuning control voltage $V_C$ range is thus decoupled from the gain of the loop filter and amplifier 306 allowing even further reductions in phase noise and improved stability.

The control voltage $V_C$ is generated by using the correction voltage $V_P$ to adjust an amount determined by the offset voltage $V_{OFF}$. Specifically, the offset voltage $V_{OFF}$ and the correction voltage $V_P$ are summed in the loop filter and amplifier 306. The offset voltage $V_{OFF}$ is provided to the noninverting terminal of the op-amp 310. The correction voltage $V_P$ is provided through the LPF 308 and resistor $R_2$ to the inverting terminal of the op-amp 310. The op-amp 310 operates according to equation (2):

$$V_C = \left(V_{OFF}\left(1 + \frac{R_2}{R_P}\right)\right) - V_P \qquad (2)$$

where $R_p$ is equal to the parallel equivalent value of $R_1$ and $R_2$.

In order to illustrate the operation of the PLL 300, it will be assumed that resistors $R_1=1$ K$\Omega$ and $R_2=3$ K$\Omega$ and that $V_{OFF}=3$ Volts. Using these values, equation (2) provides:

$$V_C = \left(V_{OFF}\left(1 + \frac{3\,K}{.75\,K}\right)\right) - V_P$$

$$V_C = (15) - V_P$$

This example illustrates that a wide range of values for $V_C$ can be produced without adding any gain to the correction voltage $V_P$. Instead, the offset voltage $V_{OFF}$ is selected to shift the control voltage $V_C$ approximately into the range necessary to tune the desired frequency. Because $V_P=0–5$ Volts, a value of $V_{OFF}=3$ Volts provides a $V_C$ range of 10–15 Volts.

Similarly, a value of $V_{OFF}=1$ Volt will provide a $V_C$ range of 0–5 Volts. In this way the offset voltage $V_{OFF}$ can be used to generate a 5 Volt wide window for the control voltage $V_C$ that is movable from 0–20 Volts, or even a wider range.

The above example also illustrates that the resulting control voltage $V_C$ is substantially equal to the difference between an amount determined by the offset voltage $V_{OFF}$ (15 in the example) and the correction voltage $V_P$. A certain amount of gain is applied to the offset voltage $V_{OFF}$ by the op-amp 310. It should also be noted that in the illustrated embodiment of the PLL 300, the connection of the correction voltage $V_P$ results in the frequency tuning direction versus the control voltage $V_C$ tuning direction being reversed from that described above with respect to the PLLs 100, 200.

Figure 6:
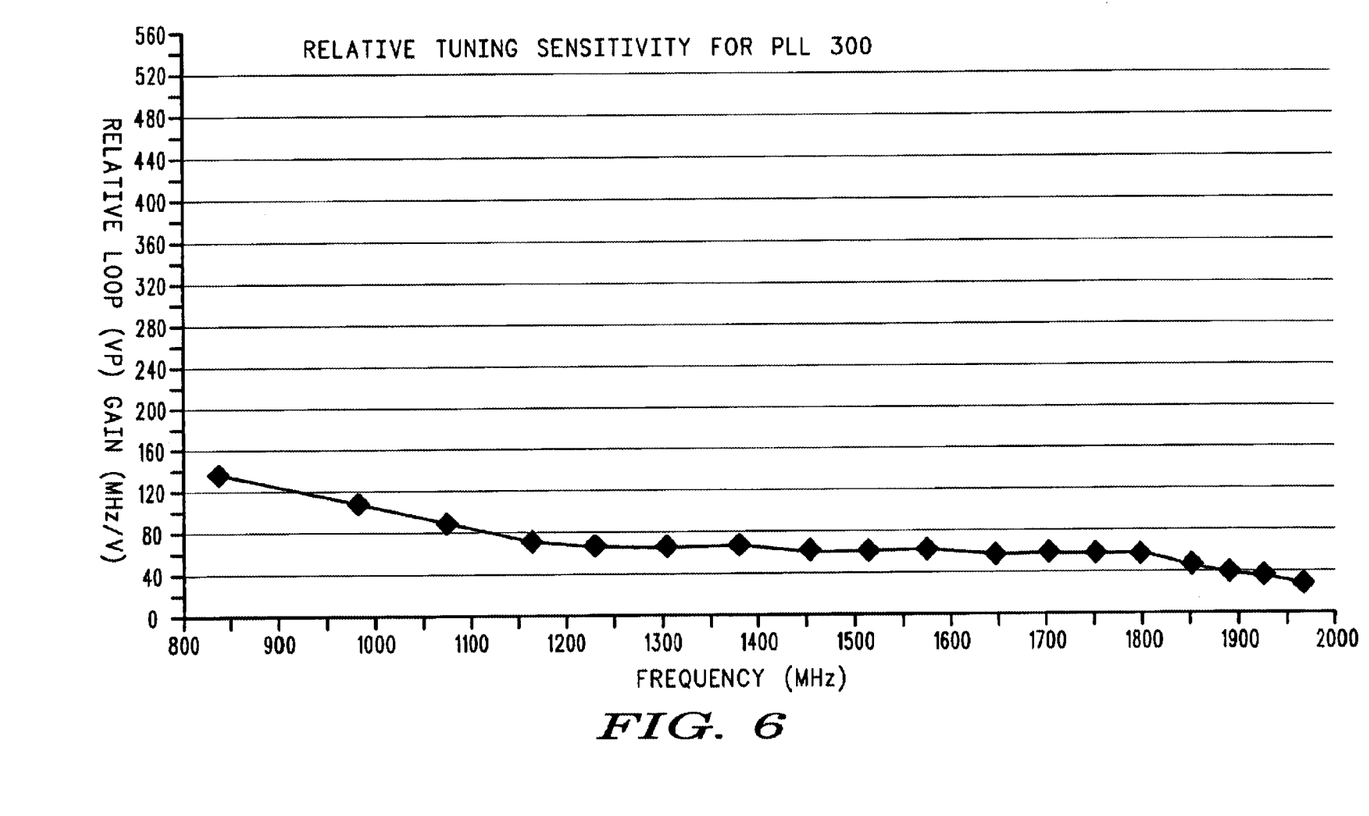
FIG. 6 is a gain versus frequency plot illustrating the operation of the PLL shown in FIG. 5.

FIG. 6 illustrates a loop gain sensitivity (i.e., sensitivity of the correction voltage $V_P$) versus frequency plot for the PLL 300. The illustrated gain is 0.25 of what is required for the PLL 100 (See FIG. 2). With the PLL 300, no gain is added to the correction voltage $V_P$.

It should be understood that many different values for the resistors $R_1$ and $R_2$ may be used in accordance with the present invention. The specific values will depend on the VCO 302 characteristics, the specific application, as well as other factors. Furthermore, the offset voltage $V_{OFF}$ may be generated in many different ways. For example, $V_{OFF}$ may be generated by a central processing unit (CPU) that controls a digital-to-analog (D/A) converter. The CPU control could be based on a frequency, offset-voltage look-up table (LUT). The LUT would be generated based on the known characteristics of the VCO 302, the values used for equation (2), and the target voltage range for the control voltage $V_C$. Using this scheme, $V_{OFF}$ could be under complete software control. It should be understood, however, that there are many other ways that the offset voltage $V_{OFF}$ could be generated in accordance with the present invention.

Using the movable window for the control voltage $V_C$, the PLL 300 locks and maintains closed loop control as expected. Large amounts of closed loop gain are unnecessary to generate the required control voltages because the offset voltage $V_{OFF}$ provides the shift rather than the gain. The PLL 300 gives another degree of freedom in that the gain of the loop filter and amplifier 306 can be set to whatever practical value is desired, including gains of less than one.

Figure 7:
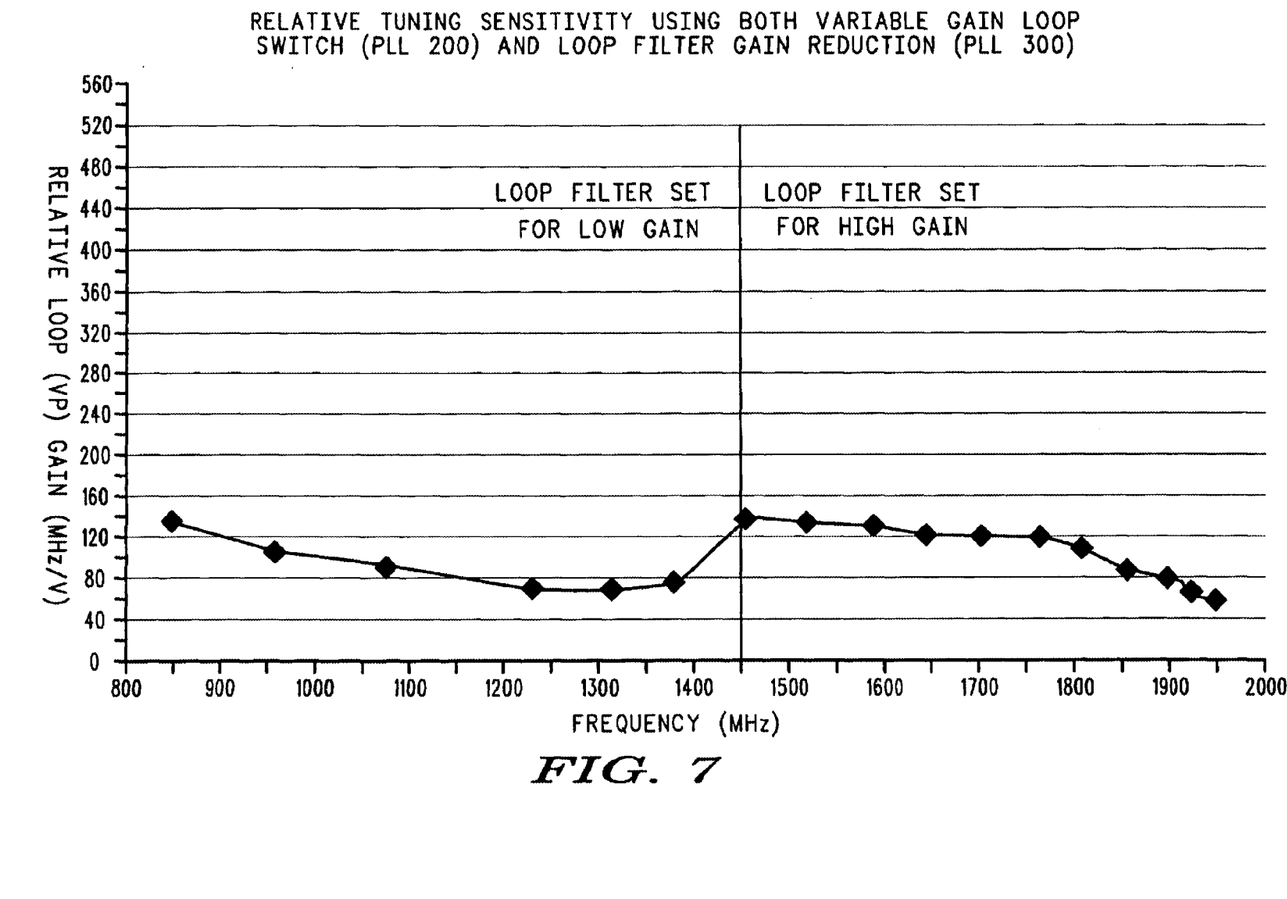
FIG. 7 is a gain versus frequency plot illustrating a combination of the techniques used by the PLLs shown in FIGS. 3 and 5.

Referring to FIG. 7, there is illustrated a loop gain sensitivity versus frequency plot for a combination of the techniques used in the PLL 200 and the PLL 300. In other words, the plot combines the variable gain loop switch used in the PLL 200 with the loop filter gain reduction used in the PLL 300. In this scenario the tuning response curve is equalized and flattened pursuant to the principles used in the PLL 200, and the overall loop gain is lowered pursuant to the principles used in the PLL 300. The combination of the PLLs 200, 300 can lead to further phase noise and stability improvements.

A large range for the control voltage $V_C$ is needed for tuning a wideband VCO to operate over the wide downstream frequency band in an HFC data network. Multiple band-split upconverter modules were previously required, necessitating double (or more) the number of modules that needed to be stocked at the manufacturer's site for spares or future system expansion. Both the PLL 200 and the PLL 300 make it possible to meet full band DOCSIS CMTS phase noise specifications and stability requirements with a single VCO upconverter module which covers the full downstream frequency range. The PLL 200 is simpler to implement and applies the gain reduction only where it is needed most at low frequencies where the tuning sensitivity is at its highest. The PLL 300 provides for even better across the band phase noise improvement. Changing frequency plans on an installed system is also simpler using the present invention because such change can be made with only a CMTS software configuration change as opposed to potentially both a module swap and a software change.

While the invention herein disclosed has been described by the specific embodiments and applications thereof, numerous modifications and variations could be made thereto by those skilled in the art without departing from the scope of the invention set forth in the claims.

What is claimed is:

1. A method of controlling a voltage controlled oscillator (VCO) in a phase-locked loop (PLL), comprising the steps of:

receiving an input signal which is phase fluctuation independent and that indicates whether the VCO is to operate in a first range of frequencies or a second range of frequencies;

applying a first amount of gain to a correction voltage to generate a control voltage when the input signal, which is phase fluctuation independent, indicates that the VCO is to operate in the first range of frequencies;

applying a second amount of gain to the correction voltage to generate the control voltage when the input signal, which is phase fluctuation independent, indicates that the VCO is to operate in the second range of frequencies; and providing the control voltage to the VCO.

2. A method in accordance with claim 1, wherein the step of applying a first amount of gain to a correction voltage comprises the step of:

configuring an operational amplifier to generate the first amount of gain.

3. A method in accordance with claim 1, wherein the step of applying a first amount of gain to a correction voltage comprises the step of:

controlling a transistor with the input signal, wherein the transistor configures an operational amplifier to generate the first amount of gain.

4. A method in accordance with claim 1, wherein the step of applying a second amount of gain to the correction voltage comprises the step of:

configuring an operational amplifier to generate the second amount of gain.

5. A method in accordance with claim 1, wherein the step of applying a second amount of gain to the correction voltage comprises the step of:

controlling a transistor with the input signal, wherein the transistor configures an operational amplifier to generate the second amount of gain.

6. A method in accordance with claim 1, wherein the first range of frequencies comprises a range of frequencies below a middle operating frequency of the VCO and the second range of frequencies comprises a range of frequencies above the middle operating frequency of the VCO.

7. A method in accordance with claim 1, wherein the second amount of gain is greater than the first amount of gain.

8. A method in accordance with claim 1, further comprising the step of:

filtering the correction voltage.

9. A method in accordance with claim 1, further comprising the step of:

comparing an output voltage of the VCO to a reference voltage to generate the correction voltage.

10. A phase-locked loop (PLL), comprising:

a voltage-controlled oscillator (VCO);

a comparator coupled to an output of the VCO and configured to generate a correction voltage;

a loop filter and amplifier configured to generate a VCO control voltage in response to the correction voltage, wherein the loop filter and amplifier is further configured to apply a first amount of gain to the correction voltage in response to an input signal indicating that the VCO is to operate in a first range of frequencies and to apply a second amount of gain to the correction voltage in response to an input signal indicating that the VCO is to operate in a second range of frequencies, wherein the input signal is phase fluctuation independent.

11. A PLL in accordance with claim 10, wherein the loop filter and amplifier comprises:

an operational amplifier having an output that produces the VCO control voltage; and means for configuring the operational amplifier to generate the first and second amounts of gain in response to the input signal.

12. A PLL in accordance with claim 11, wherein the means for configuring comprises:

a transistor responsive to the input signal and configured to short a resistance coupled to the operational amplifier when the transistor is turned on.

13. A PLL in accordance with claim 10, wherein the loop filter and amplifier comprises:

a filter for filtering the correction voltage.

14. A PLL in accordance with claim 10, wherein the first range of frequencies comprises a range of frequencies below a middle operating frequency of the VCO and the second range of frequencies comprises a range of frequencies above the middle operating frequency of the VCO.

15. A PLL in accordance with claim 10, wherein the second amount of gain is greater than the first amount of gain.

16. A method of controlling a voltage controlled oscillator (VCO) in a phase-locked loop (PLL), comprising the steps of:

receiving a variable analog offset voltage at a first input of an amplifier;

providing a correction voltage to a second input of the amplifier;

using the variable analog offset voltage to generate a first value of a control voltage;

using the correction voltage to adjust the first value of the control voltage in order to generate a second value of the control voltage, wherein the variable analog offset voltage is summed with the correction voltage to increase the range of the control voltage; and providing the second value of the control voltage to the VCO, wherein the variable analog offset voltage is amplified more than the correction voltage.

17. A method in accordance with claim 16, wherein the step of using the correction voltage comprises the step of:

generating the second value of the control voltage to be substantially equal to a difference between the first value of the control voltage and the correction voltage.

18. A method in accordance with claim 16, wherein the step of using the correction voltage comprises the step of:

using an operational amplifier to generate a difference between the first value of the control voltage and the correction voltage.

19. A method in accordance with claim 16, wherein the step of using the correction voltage comprises the step of:

applying gain to the offset voltage to generate the first amount.

20. A method in accordance with claim 16, further comprising the step of:

filtering the correction voltage.

21. A method in accordance with claim 16, further comprising the step of:

comparing an output voltage of the VCO to a reference voltage to generate the correction voltage.

22. A phase-locked loop (PLL), comprising:

a voltage-controlled oscillator (VCO);

a comparator coupled to an output of the VCO and configured to generate a correction voltage; and a loop filter and amplifier configured to generate a VCO control voltage by using the correction voltage to adjust an initial value of the VCO control voltage, wherein the amplifier sums the correction voltage and a variable analog offset voltage to generate the VCO control voltage, and wherein the amplifier amplifies the variable analog offset voltage more than the amplifier amplifies the correction-voltage.

23. A PLL in accordance with claim 22, wherein the loop filter and amplifier is further configured to generate the VCO control voltage to be substantially equal to a difference between the initial value of the VCO control voltage and the correction voltage.

24. A PLL in accordance with claim 22, wherein the loop filter and amplifier is further configured to apply gain to the offset voltage to generate the initial value of the VCO control voltage.

25. A PLL in accordance with claim 22, wherein the loop filter and amplifier comprises:

an operational amplifier having an output that produces the VCO control voltage; and means for configuring the operational amplifier to generate a difference between the initial value of the VCO control voltage and the correction voltage.

26. A PLL in accordance with claim 22, wherein the loop filter and amplifier comprises:

a filter for filtering the correction voltage.

* * * * *

UNITED STATES PATENT AND TRADEMARK OFFICE
CERTIFICATE OF CORRECTION

PATENT NO. : 6,664,826 B1
DATED : December 16, 2003
INVENTOR(S) : Creed et al.

It is certified that error appears in the above-identified patent and that said Letters Patent is hereby corrected as shown below:

Column 10,
Line 26, change "correction-voltage" to -- correction voltage --

Signed and Sealed this

Fifteenth Day of June, 2004

JON W. DUDAS
*Acting Director of the United States Patent and Trademark Office*